United States Patent
Suzuki

(12) 
(10) Patent No.: US 6,261,855 B1
(45) Date of Patent: Jul. 17, 2001

(54) METHOD FOR FABRICATING A SEMICONDUCTOR OPTICAL DEVICE

(75) Inventor: Naofumi Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/491,630

(22) Filed: Jan. 26, 2000

(30) Foreign Application Priority Data

Jan. 26, 1999 (JP) .................................................. 11-016924

(51) Int. Cl.$^7$ .................................................. H01L 21/00
(52) U.S. Cl. .................................................. 438/23; 438/39
(58) Field of Search .................................................. 438/39, 23

(56) References Cited

U.S. PATENT DOCUMENTS

| | | | |
|---|---|---|---|
| 4,230,997 | * 10/1980 | Hartman et al. | 331/94.5 |
| 4,640,737 | * 2/1987 | Nagasaka et al. | 156/643 |
| 5,237,639 | * 8/1993 | Kato et al. | 385/131 |
| 5,568,499 | * 10/1996 | Lear | 372/45 |
| 5,847,415 | 12/1998 | Sakata . | |
| 5,869,849 | * 2/1999 | Jou et al. | 257/96 |

FOREIGN PATENT DOCUMENTS

| | | |
|---|---|---|
| 01-313985 | 12/1989 | (JP) . |
| 2-177489 | 7/1990 | (JP) . |
| 05-013876 | 1/1993 | (JP) . |
| 5-13876 | 1/1993 | (JP) . |
| 8-330676 | 12/1996 | (JP) . |
| 10-75009 | 3/1998 | (JP) . |
| 10-215023 | 8/1998 | (JP) . |
| 10-308556 | 11/1998 | (JP) . |

OTHER PUBLICATIONS

V. Lakovlev et al. "High Performance AlGaAs–based laser diodes: fabrication, characterization, and applications", Microelectronics Journal, GB, Mackintosh Publications Ltd., vol. 29, No. 3, Mar. 1, 1998 pp. 97–104.

\* cited by examiner

*Primary Examiner*—Matthew Smith
*Assistant Examiner*—Renzo N. Rocchegiani

(57) ABSTRACT

A mesa structure including an active layer is formed by selective growth on a semiconductor substrate and a layer containing aluminum is grown on the topmost part of the mesa structure. This aluminum-containing layer is then oxidized and used as a mask to form current blocking layers.

6 Claims, 4 Drawing Sheets

METHOD FOR FABRICATING A SEMICONDUCTOR OPTICAL DEVICE

BACKGROUND OF THE INVENTION

1. Field of the Invention

The present invention relates to a method for fabricating a semiconductor optical device, and more specifically it relates to a method for fabricating a semiconductor optical device suitable for application to an optical device such as semiconductor laser, a semiconductor optical amplifier, a semiconductor modulator, or a combination of such devices, which are used as major constituent elements in an optical communication systems.

2. Background of the Invention

Vapor phase epitaxial growth such as metal organic vapor phase epitaxial (MOVPE) growth feature superior control of film thickness, high uniformity and reproducibility of thickness, electrical and optical characteristics of grown films. So, they are of particular use in the fabrication of compound semiconductor electronic devices and optical devices. In crystal growth using MOVPE, if a mask is formed using a dielectric film on part of the substrate so as to inhibit crystal growth, the composition and growth rate of alloy semiconductor selectively grown on aperture region vary depending upon the mask width. In particular in the case of an MQW structure, not only the composition of each layer, but also the well layer thickness affects the bandgap, so that the bandgap is highly dependent upon the mask width. Using this effect, by varying the mask width in the light propagating direction, it is possible to fabricate integrated optical devices, for example, in which a laser and an optical modulator are grown simultaneously.

In semiconductor optical device structures, a buried structure is commonly used. The structure consists of mesa stripe active region that generates, amplifies or modulates laser light, and buried current blocking layers on the both sides of it. To achieve single-mode laser light output, the width of the active layer must be narrower than approximately 2 μm. Therefore, to manufacture an optical device having a buried structure, it is necessary to have a step of forming a mesa stripe having a width of 2 μm or less, and a step of forming a current stopping layer on both sides thereof.

Optical devices having a buried structure with current blocking layers using the above-noted selective growth are generally fabricated by using the following two methods. One method as follows. An active layer is grown by selective growth with a mask having a relatively wide aperture width of 10 μm or greater. Then dielectric stripe having a width of 1 to 2 μm is formed on the growth region by photolithography. Using this stripe as a mask, a mesa stripe is formed by etching, and then current blocking layers are grown. The other method is as follows. An active layer is grown by selective growth with a mask having an aperture width of 1 to 2 μm. In this case, the mesa stripe with (111)B side facets is formed during growth. In the latter method, because an active mesa stripe structure having a width of 1 to 2 μm is formed by this growth, it is not necessary to adjust the active stripe width before the current blocking layer growth using other process such as photolithography and etching. Therefore, high uniformity and reproducibility of the active mesa structure can be achieved. This method also has an advantage that no crystal fault caused by etching of semiconductor is generated. Because of the above-noted characteristics, by using this method, it is possible to manufacture an optical device featuring superior uniformity, reliability, and reproducibility. Using this method, however, in order to growth current blocking layers, a process step of forming a dielectric film only on the top of the mesa structure is needed. This process is extremely difficult using positioning by the normal photolithography process because the width of the top of mesa structure is only approximately 1 μm. For this reason, a self-alignment process has been proposed (Sakata et al., Photo Tech. Lett., Vol. 8, No. 2, 1996). In this process, difference of the thickness of a $SiO_2$ film formed by thermal CVD between the top and the sides of the mesa structure is utilized. By using this process, it becomes possible to form a dielectric layer on only the top of a mesa structure having a width of 1 μm or less. This method requires the following steps, as shown in FIG. 4.

(a) Formation of a $SiO_2$ 403 by thermal CVD.
(b) Removal of the $SiO_2$ on both sides of the mesa by etching.
(c) Formation of a resist strip 404 so as to cover the mesa 402, using photolithograhy.
(d) Removal of the $SiO_2$ from both sides of the mesa, using side etching.
(e) Removal of the resist 404.

In the above-noted steps, at the (b) step it is necessary to precisely control the etching speed and time, and at the (c) step it is necessary to precisely control the positioning so that the mesa stripe is positioned in the approximate center of the resist stripe 404.

Thus, in order to form a dielectric layer on only the top of a mesa structure having a width of approximately 1 μm, many process steps are needed, including steps requiring high precision, thereby making it difficult to improve the throughput.

The purpose of the present invention is to provide a novel method for fabricating a semiconductor optical device featuring greatly simplified process steps. It makes possible to use of a mesa structure including an active layer formed by selective growth as waveguide without etching, and to form a buried structure with current blocking layers without precise control of the etching rate and positioning during photolithography. It results superior uniformity, reproducibility and high throughput in manufacturing optical devices.

SUMMARY OF THE INVENTION

In order to achieve the above-noted purpose, the present invention has the following basic technical constitution.

A first aspect of the present invention is a method for fabricating a semiconductor optical device having the steps of: forming a mesa structure including an active layer and a layer containing aluminum on a topmost part of the mesa structure on a semiconductor substrate by selective growth; oxidizing the layer that contains aluminum so as to form an oxide layer thereon; and growing a current blocking layer using the oxide layer as a mask.

In a second aspect of the present invention, the lattice constant of the layer containing aluminum formed on the topmost part of the mesa structure matches with that of said semiconductor substrate.

In a third aspect of the present invention, the semiconductor substrate is made of InP, and the layer containing aluminum formed on the topmost part of the mesa structure is made of either InAlAs or AlGaAs.

In a fourth aspect of the present invention, the semiconductor substrate is made of GaAs, and the layer containing aluminum formed on the topmost part of the mesa structure is made of either AlAs or AlGaAs.

In a fifth aspect of the present invention, the layer containing aluminum formed on the topmost part of the mesa structure is made of AlAs.

In a sixth aspect of the present invention, the active layer contains aluminum.

In a method for fabricating a semiconductor optical device according to the present invention, a layer containing aluminum, made of InAlAs or the like, is formed on the topmost part of an active mesa structure. Then this layer is oxidized and used as a mask for current blocking layer growth, in place of the dielectric film that was used in the prior art. In this case, because the layer containing aluminum is grown only on the top surface of the mesa structure, complex process steps as used in the past to form a dielectric film on only the top part of the mesa become unnecessary. It makes the process to form mask for current blocking layer growth much simpler. After current blocking layer growth, the layer containing aluminum is removed by selective etching, and buried layers and contact layers are grown, thereby completing the fabricating of the laser structure.

DESCRIPTION OF THE PREFERRED EMBODIMENTS

Embodiments of a method for fabricating a semiconductor optical device according to the present invention are described in detail below, with references being made to relevant accompanying drawings.

FIG. 1 shows the fabricating process steps in a first embodiment of the present invention. This method includes a step of forming a mesa structure M including an active layer and a layer 106 containing aluminum on the topmost part of the mesa structure M by selective growth on a semiconductor substrate 101, a step of oxidizing the layer 106 that contains aluminum so as to form an oxide layer 107, and a step of using the above-noted oxide layer 107 as a mask to grow current blocking layers 108 and 109.

The first embodiment of the present invention is described below, referring FIG. 1. In this case the optical device fabricated is a semiconductor laser.

Figure 1A:
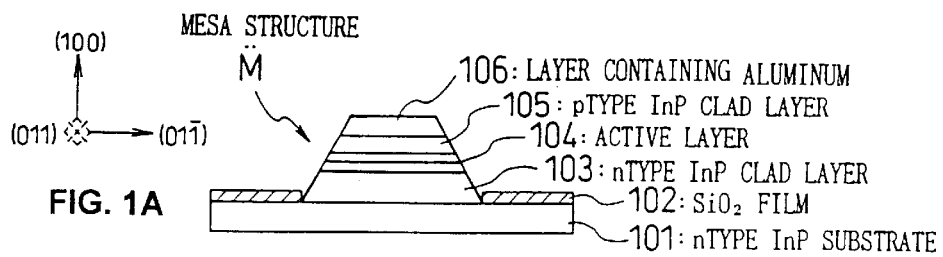
FIG. 1 is a process diagram illustrating a method for fabricating a semiconducter laser according to the first embodiment of the present invention.
Figure 1B:
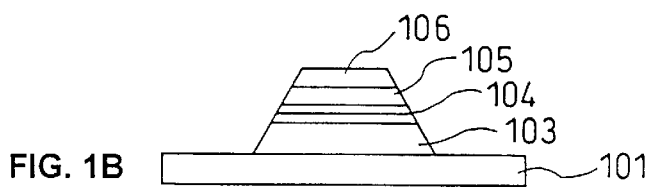
Figure 1C:
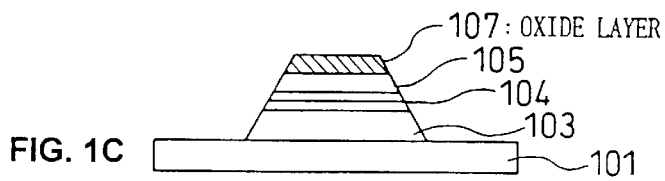
Figure 1D:
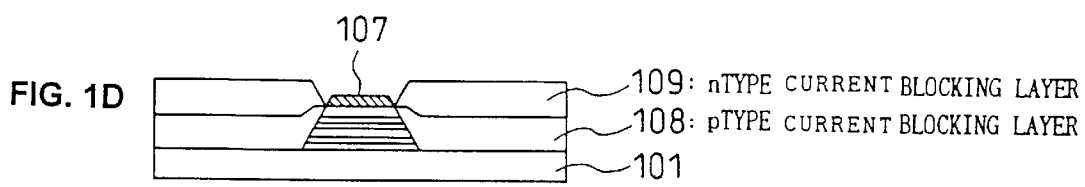
Figure 1E:
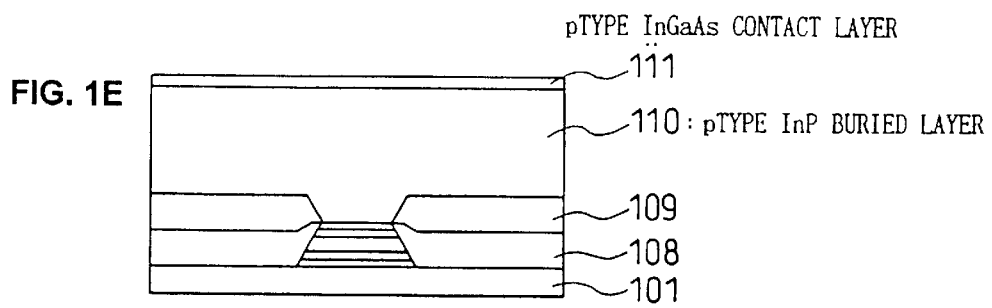
Figure 2A:
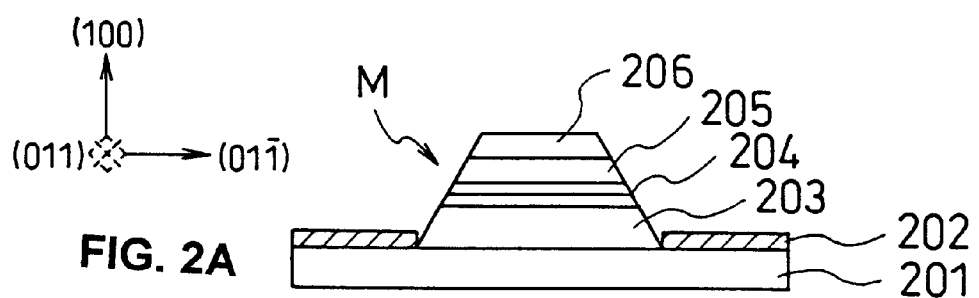
FIG. 2 is a process diagram illustrating a method for fabricating a semiconductor laser according to the second embodiment of the present invention.
Figure 2B:
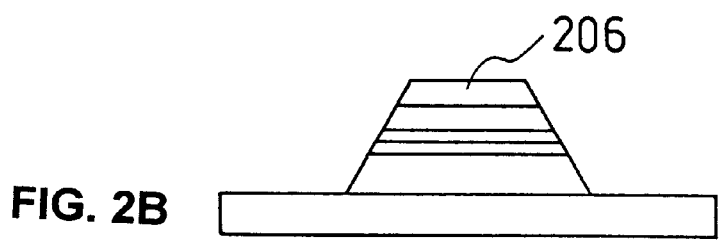
Figure 2C:
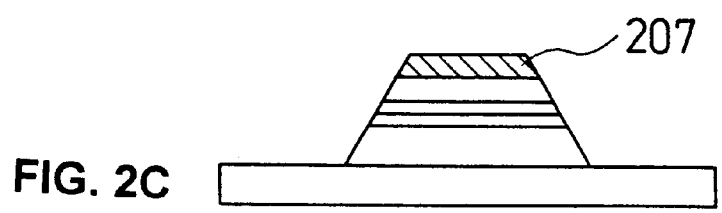
Figure 2D:
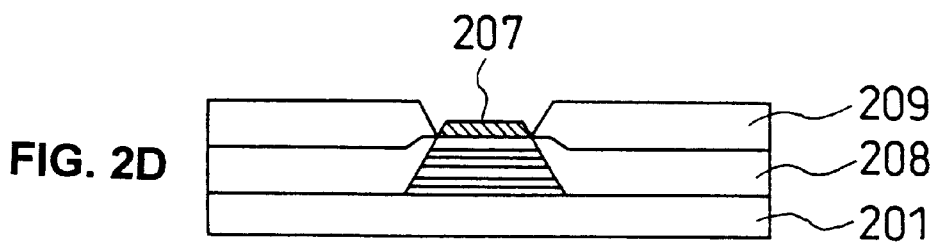
Figure 2E:
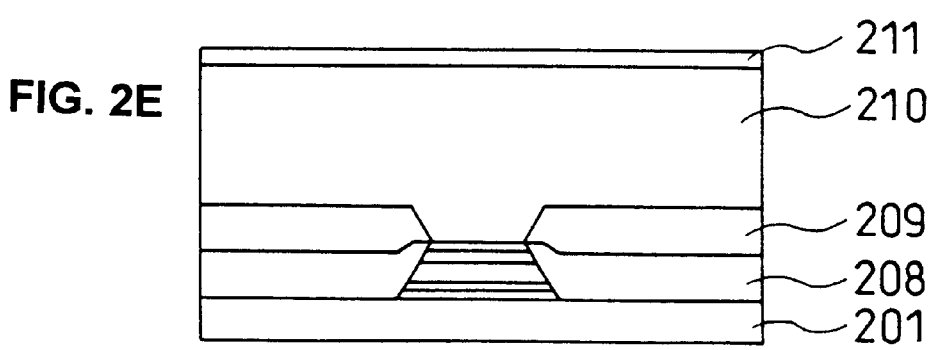
Figure 3A:
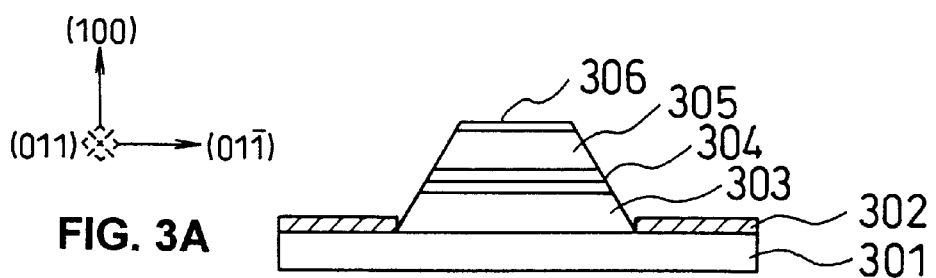
FIG. 3 is a process diagram illustrating a method for fabricating a semiconductor laser according to the third embodiment of the present invention.
Figure 3B:
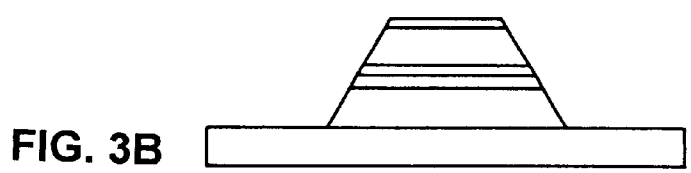
Figure 3C:
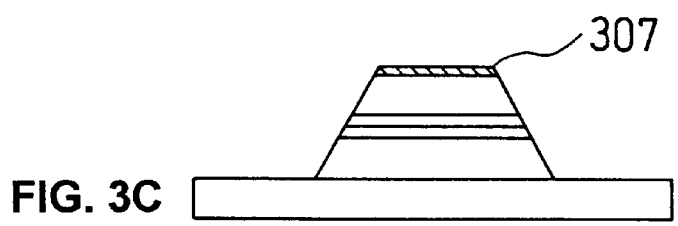
Figure 3D:
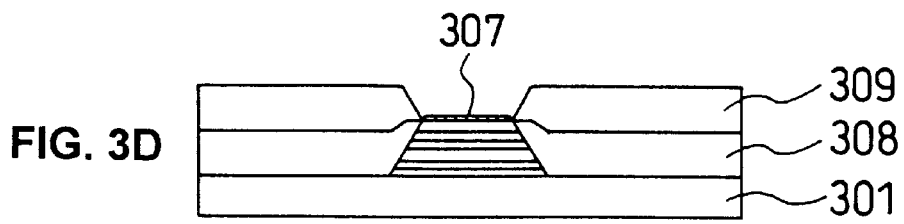
Figure 3E:
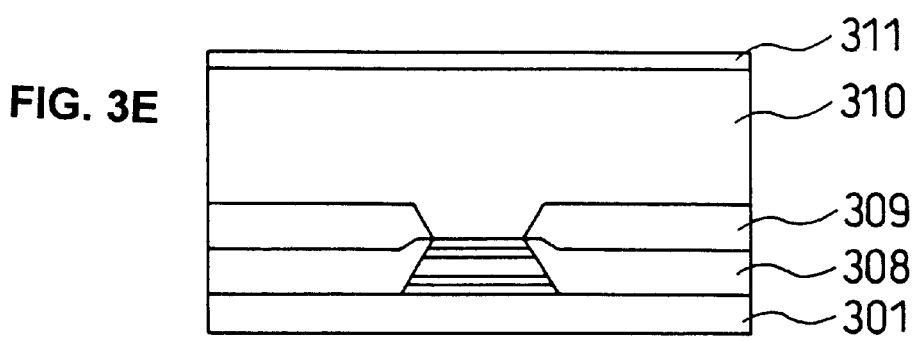
Figure 4A:
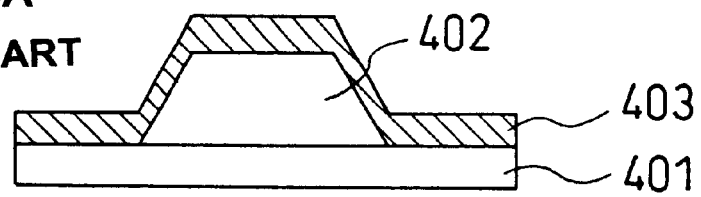
FIG. 4 is a process diagram illustrating a process step of forming a dielectric layer on only the top surface of a mesa structure including an active layer formed by selected growth, as practiced in the prior art.
Figure 4B:
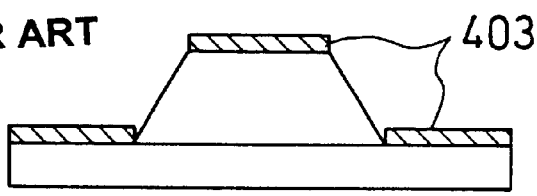
Figure 4C:
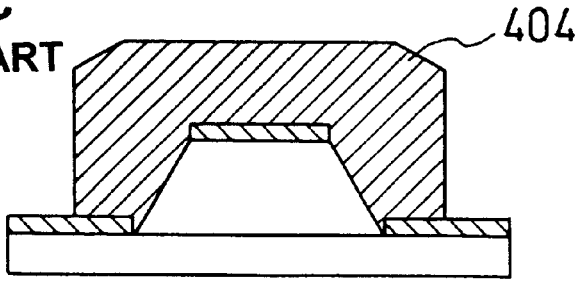
Figure 4D:
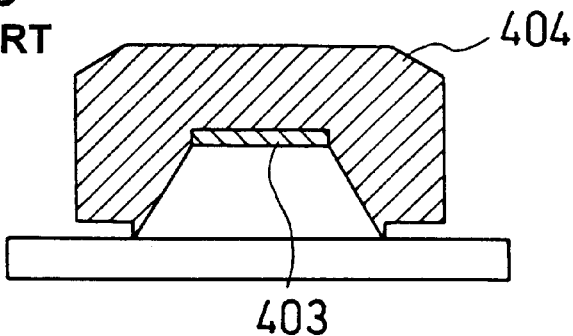
Figure 4E:
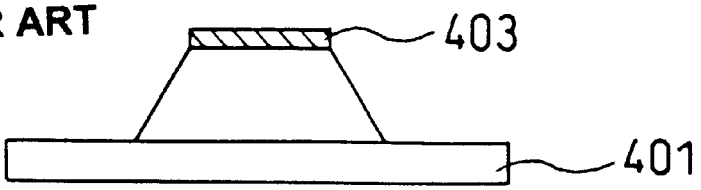

First, an $SiO_2$ film having a thickness of 100 nm is fabricated onto a (100) n-type InP substrate 101 by thermal CVD (FIG. 1(a)). Next, a pair of $SiO_2$ stripes with a pitch of 300 $\mu$m, a width of 5 $\mu$m and a spacing of 1.5 $\mu$m is formed by photolithography and etching with buffered HF (BHF) in the <011> direction of the substrate 101. Next, metal organic vapor phase epitaxial (MOVPE) growth is used to grow an n-type InP clad layer 103 (having a thickness of 0.15 $\mu$m and a carrier density of $1\times10^{18}$ $cm^{-3}$) on the n-type InP substrate 101 patterned as noted above. Next, an active layer structure 104 consisting of an SCH (separate confinement hetero-structure) layer (60 nm on both sides of an MQW layer to be described later) of InGaAsP with bandgap wavelength of 1.1 $\mu$m and an MQW (multi-quantum well) layer (emitting wavelength of 1.3 $\mu$m) consists of seven InGaAsP well layers and six InGaAsP barrier layers. The well layers are 1.0% compressively strained, and thickness of each layer is 5 nm, bandgap wavelength is 1.4 um. Thickness of the each barrier layer is 10 nm and bandgap wavelength is 1.1 um. Then a p-type InP clad layer 105 (with a thickness of 0.1 $\mu$m and a carrier density of $7\times10^{17}$ $cm^{-3}$) are grown in this sequence, over which an InAlAs layer 106 that lattice-matches with InP, is formed to a thickness of 0.1 $\mu$m as the topmost layer. After this growth, $SiO_2$ mask used in the active layer mesa selective growth is removed using BHF.

Next, an oxidation step is performed for 20 minutes at 670° C. in an $N_2$ atmosphere that includes steam. Because the InAlAs layer includes aluminum which is at the surface, it is easily oxidized (FIG. 1(c)), however the other layers, since they do not contain aluminum, are not oxidized. Then, the oxidized InAlAs layer 107 formed by the above-noted process step is used as a mask to grow a p-type InP current blocking layer 108 (with a thickness of 0.75 $\mu$m and a carrier density of $6\times10^{17}$ $cm^{-3}$) and then grow an n-type InP current blocking layer 109 (with a thickness of 0.6 $\mu$m and a carrier density of $3\times10^{18}$ $cm^{-3}$) (FIG. 1(d)). After this growth, the above-noted oxide layer is removed by selective etching, and then finally a p-type InP buried layer 110 (with a thickness of 2 $\mu$m and a carrier density of $1\times10^{18}$ $cm^{-3}$) and a p-type InGaAs contact layer 111 (with a thickness of 0.3 $\mu$m and a carrier density of $5\times10^{18}$ $cm^{-3}$) are grown (FIG. 1(e)), thereby completing the laser structure.

In this method, it is extremely easy to form a mask on only the top of the mesa stripe for growth of current reproducibility, because it is possible to form a mask without the influence of variations in dielectric film thickness in wafer. In depositing the dielectric film onto the top of a mesa structure, there is a small change in the shape of the film with a change in the height of the mesa. So, it was difficult to form dielectric mask in case there are various height mesa structures in a wafer. In this embodiment of the present invention, however, the mask can be formed without regard to the height of the mesa. Therefore, even in case of devices which has different parts of the mesa with different height, for example a spot-size conversion laser diode (SSC-LD), it is possible to achieve uniformity and reproducibility superior to that possible in the past. In fabrication of devices such as SSC-LDs or optical integrated circuits, the composition and the growth rate change correspond to mask width change is utilized. Therefore, the composition and thickness of the layer containing aluminum formed on the topmost part of the active layer mesa will also differ at different parts of the device. Even in such as case, however, by using layer which lattice-matched with the InP substrate, such as is done in this embodiment, even if there is some variation in composition and thickness, it is possible to form a high-quality layer including aluminum.

The second embodiment of a method for fabricating a laser diode according to the present invention is described below, with reference being made to FIG. 2.

First, using the same method as used in the first embodiment, a pair of $SiO_2$ stripes are formed with a pitch of 300 $\mu$m, a width of 5 $\mu$m and a spacing of 1.5 $\mu$m in the <011> direction of the n-type GaAs substrate 201, the surface of which is a (100) crystal facet. Next, metal organic vapor phase epitaxial (MOVPE) growth is used to grow an n-type InP clad layer 203 (having a thickness of 0.15 $\mu$m and a carrier density of $1\times10^{18}$ $cm^{-3}$) on the n-type GaAs substrate 201 patterned as noted above. Next, an active layer structure 204 consisting of an SCH layer (100 nm on both sides of an MQW layer to be described later) of InGaAsP with bandgap wavelength of 0.78 μm and an MQW (multi-quantum well) layer (emitting wavelength of 0.98 μm) consists of a 5 $In_{0.2}Ga_{0.8}As$ well layers and four 7 nm bandgap wavelength is 0.78 μm. Then, a p-type InGaP clad layer 205 (with a thickness of 0.1 μm and a carrier density of $7\times10^{17}$ $cm^{-3}$) are grown in this sequence, over which an AlAs layer 206 is formed to a thickness of 0.1 μm the topmost layer (FIG. 2(b)). After this growth, the $SiO_2$ mask used in the active layer mesa selective growth is removed using the same method as used in the first embodiment, and the topmost AlAs layer is oxidized (FIG. 2(c)). In this case, similar to the first embodiment, parts other than the topmost layer are not oxidized. Then the oxidized AlAs layer 207 formed by the above-noted process step is used as a mask to grow a p-type InGaP current blocking layer 208 (with a thickness of 0.75 μm and a carrier density of $6\times10^{17}$ $cm^{-3}$) and then grow n-type InGaP current blocking layer 209 (with a thickness of 0.6 μm and a carrier density of $3\times10^{18}$ $cm^{-3}$) (FIG. 2(d)). After this growth, the above-noted oxide layer is removed by selective etching, and then finally a p-type InGaP buried layer 210 (with a thickness of 2 μm and a carrier density of $1\times10^{18}$ $cm^{-3}$) and a p-type GaAs contact layer 211 (with a thickness of 0.3 μm and a carrier density of $5\times10^{18}$ $cm^{-3}$) are grown, thereby completing the laser structure.

In this embodiment, the composition of InGaP layers are controlled as the lattice constant of those layers matches with that of GaAs. The lattice constant of AlAs used on the topmost layer almost matches with that of GaAs and there is no composition change in AlAs layer correspond to a change in mask width. Thus, even in case there is a change in mask width over the wafer, such as SSC-LDs or optical integrated circuits described with regard to the first embodiment, it is possible to form a film having a good crystalline structure. Additionally, because the AlGaAs almost lattice-matches with the GaAs, no problem arises if AlGaAs is used in place of the AlAs noted above.

The third embodiment of a method for fabricating a laser diode according to the present invention is described below, with reference being made to FIG. 3.

First, using the same method as used in the second embodiment a pair of $SiO_2$ stripes are formed with a pitch of 300 μm, a width of 5 μm and a spacing of 1.5 μm in the <011> direction of the n-type InP substrate 301, the surface of which is a (100) crystal facet. Next, metal organic vapor phase epitaxial (MOVPE) growth is used to grow an n-type InP clad layer 303 (having a thickness of 0.15 μm and a carrier density of $1\times10^{18}$ $cm^{-3}$) on the n-type InP substrate 301 patterned as noted above. Next, an active layer structure 304 consisting of an SCH layer (60 nm on both sides of an MQW layer to be described later) of InAlGaAs with bandgap wavelength of 1.0 an MQW layer made an MQW (multi-quantum well layer (emitting wavelength of 1.3 um) consists of seven InAlGaAs well layers and six InAlGaAs barrier layers. The well layers are 1.0% compressively strained, and thickness of each layer is 5 nm, bandgap wavelength is 1.4 um. Thickness of the each barrier layer is 10 nm and bandgap wavelength is 1.1 um. Then a p-type InP clad layer 305. are grown in this sequence, over which an AlAs layer 306 is formed to a thickness of 10 nm as the topmost layer. After this growth, the $SiO_2$ mask that was used in the active layer mesa selective growth is removed using BHF (FIG. 3(b)). Then an oxidation step is done for 1 minute at 670° C. in an $N_2$ atmosphere that includes steam, so as to form the oxidized AlAs layer 307. Then the oxidized AlAs layer 307 formed by the above-noted process step is used as a mask to grow a p-type InP current blocking layer 308 (with a thickness of 0.75 μm and a carrier density of $6\times10^{17}$ $cm^{-3}$) and then grow n-type InP current blocking layer 309 (with a thickness of 0.6 μm and a carrier density of $3\times10^{18}$ $cm^{-3}$) (FIG. 3(d)) After this growth, the above-noted oxide layer 307 is removed by selective etching, and then finally a p-type InP buried layer 310 (with a thickness of 2 μm and a carrier density of $1\times10^{18}$ $cm^{-3}$) and a p-type InGaAs contact layer 311 (with a thickness of 0.3 μm and a carrier density of $5\times10^{18}$ $^{cm-3}$) are grown, thereby completing the laser structure (FIG. 3(e)).

Because the topmost AlAs layer includes only Al as a Group III element, it is extremely easily oxidized in a short time. In particular, by forming a thin AlAs layer, this time can be further shortened. By shortening the oxidation time in this manner, even if a layer including aluminum, such as the active layer or SCH layer in this embodiment is used, it is possible to oxidize just the topmost part. Additionally, it should be noted that, although the lattice constant of AlAs layer at the topmost part in this embodiment does not match with that of the InP substrate, it is possible to grow the AlAs layer without lattice mismatch distortion if the film is made sufficiently thin. In the case of an AlGaAs, AlInGaAs, or AlGaInP laser grown on a GaAs substrate, because the AlAs almost completely lattice-matches with GaAs, there is almost no problem.

Furthermore, it will be understood that the present invention is not restricted the above-described embodiments, and can take on numerous variant forms within the spirit of the present invention. For example, while a bulk layer including aluminum was used as the topmost layer of an active mesa in the above-described embodiments, there is no restriction to a bulk layer, and a superlattice made of AlAs or AlInAs can be applied as well. Additionally, although in the embodiments an n-type substrate is used, it will be obvious that the present invention can be applied to the fabrication of a laser on a p-type substrate as well. In which case, of course, it is necessary to have the conduction type of each layer reversed to accommodate this change in substrate conductivity type. Additionally, while in the above-noted embodiments, InGaAsP or InAlGaAs laser is formed on an InP substrate or the case in which an InGaAsP laser is formed on a GaAs substrate, it is also possible to use a material such as InGaAlP or InGaNAs as the active layer. There is no limitation to a substrate of InP or GaAs, it is further possible to apply the present invention to the case of a AlInGaN laser on a GaN substrate. The present invention is not limited in application to semiconductor lasers, and can also be applied to the fabrication of a variety of optical integrated circuits, such as semiconductor optical amplifiers, modulators, and optical integrated circuit combined those devices.

According to the present invention as described in detail above, it is easy to form a buried structure with current blocking structures because it is not needed to form a dielectric layer on the top of the mesa structure, without precise etching rate control and accurate positioning in photolithography process. For this reason, it is possible to manufacture semiconductor optical devices with high uniformity and reproducibility, and with a high throughput. Additionally, even when fabricating a device having various mesa heights, such as seen in a spot size converted laser diode, it is possible to achieve greater uniformity and reproducibility than was possible with conventional method.

What is claimed is:

1. A method for fabricating a semiconductor optical device comprising the steps of:

forming a mesa structure including an active layer and a layer containing aluminum, only on a topmost part of said mesa structure on a semiconductor substrate by selective growth;

oxidizing only said layer that contains aluminum so as to form an oxide layer thereon; and forming a current blocking layer using only said oxide layer as a mask.

2. A method for fabricating a semiconductor optical device according to claim 1, wherein a lattice constant of said layer containing aluminum formed on a topmost part of said mesa structure matches with that of said semiconductor substrate.

3. A method for fabricating a semiconductor optical device according to claim 2, wherein said semiconductor substrate is made of InP, and said layer containing aluminum formed on a topmost part of said mesa structure is made of either InAlAs or InAlGaAs.

4. A method for fabricating a semiconductor optical device according to claim 2, wherein said semiconductor substrate is made of GaAs, and said layer containing aluminum formed on a topmost part of said mesa structure is made of either AlAs or AlGaAs.

5. A method for fabricating a semiconductor optical device according to claim 1, wherein said layer containing aluminum formed on a topmost part of said mesa structure is made of AlAs.

6. A method for fabricating a semiconductor optical device according to claim 1, wherein said active layer includes aluminum.

* * * * *